United States Patent
Bovier et al.

(10) Patent No.: US 6,617,853 B2
(45) Date of Patent: Sep. 9, 2003

(54) MAGNET ARRANGEMENT COMPRISING A SUPERCONDUCTING MAGNET COIL SYSTEM AND A MAGNETIC FIELD SHAPING DEVICE FOR HIGH-RESOLUTION MAGNETIC RESONANCE SPECTROSCOPY

(75) Inventors: Pierre-Alain Bovier, Zurich (CH); Robert Schauwecker, Zurich (CH); Andreas Amann, Zurich (CH); Daniel M. Eckert, Duebendorf (CH)

(73) Assignee: Bruker Biospin AG, Fällanden (CH)

( * ) Notice: Subject to any disclaimer, the term of this patent is extended or adjusted under 35 U.S.C. 154(b) by 0 days.

(21) Appl. No.: 10/050,997

(22) Filed: Jan. 22, 2002

(65) Prior Publication Data

US 2002/0140427 A1 Oct. 3, 2002

(30) Foreign Application Priority Data

Jan. 31, 2001 (DE) ........................................ 101 04 054

(51) Int. Cl.$^7$ ................................................. G01V 3/00
(52) U.S. Cl. ........................ 324/320; 324/309; 324/318
(58) Field of Search ................................ 324/320, 318, 324/309, 307, 311, 315

(56) References Cited

U.S. PATENT DOCUMENTS

| | | | | |
|---|---|---|---|---|
| 4,652,826 A | * | 3/1987 | Yamamoto et al. | 324/320 |
| 4,853,663 A | * | 8/1989 | Vermilyea | 335/301 |
| 4,974,113 A | * | 11/1990 | Gabrielse et al. | 361/141 |
| 5,173,661 A | * | 12/1992 | Knuttel et al. | 324/309 |
| 5,396,208 A | | 3/1995 | Overweg et al. | 361/141 |
| 6,181,137 B1 | * | 1/2001 | Havens et al. | 324/320 |
| 6,529,005 B1 | * | 3/2003 | Kasten et al. | 324/320 |

* cited by examiner

Primary Examiner—Diego Gutierrez
Assistant Examiner—Brij B. Shrivastav
(74) Attorney, Agent, or Firm—Dr. Paul Vincent

(57) ABSTRACT

A magnet arrangement comprising a superconducting magnet coil system (C) for generating a magnetic field in the direction of a z axis in a working volume (AV) disposed on the z axis about z=0, wherein the field of the magnet coil system (C) in the working volume (AV) comprises at least one inhomogeneous contribution $H_n \cdot z^n$ with $n \geq 2$ whose contribution to the total field strength on the z axis about z=0 varies with the nth power of z, and wherein a field shaping device (P) of magnetic material is provided, which is substantially cylindrically symmetrical with respect to the z axis, is characterized in that the magnet coil system (C) is provided for use in an apparatus for high-resolution magnetic resonance spectroscopy and the field shaping device (P) has, at least partially, a radial separation from the z axis of less than 80 mm and compensates for at least one of the inhomogeneous field contributions $H_n \cdot z^n$ of the magnet coil system (C) by at least 50%, wherein at least one additional coil system (S) is provided which acts as a shim device in the magnet arrangement. This permits realization of a field shaping device from magnetic material of a suitable geometry such that at least part of the notch structures for field homogenization can be omitted in the magnet coil system.

20 Claims, 2 Drawing Sheets

MAGNET ARRANGEMENT COMPRISING A SUPERCONDUCTING MAGNET COIL SYSTEM AND A MAGNETIC FIELD SHAPING DEVICE FOR HIGH-RESOLUTION MAGNETIC RESONANCE SPECTROSCOPY

The application claims Paris Convention priority of DE 101 04 054.7 filed Jan. 31, 2001 the complete disclosure of which is hereby incorporated by reference.

BACKGROUND OF THE INVENTION

The invention concerns a magnet arrangement comprising a superconducting magnet coil system for generating a magnetic field in the direction of a z axis in a working volume disposed on the z axis about z=0, wherein the field of the magnet coil system in the working volume has at least one inhomogeneous contribution $H_n \cdot z^n$ with $n \geq 2$ whose contribution to the total field strength on the z axis about z=0 varies with the nth power of z and with a field shaping device of magnetic material, which is substantially cylindrically symmetrical with respect to the z axis. The invention also concerns a method for determining the production tolerances of the magnetic field shaping device.

Such an arrangement comprising a superconducting magnet coil system and a magnetic field shaping device is known from U.S. Pat. No. 5,396,208.

Superconducting magnets are used in many fields of application, including, in particular, magnetic resonance methods, wherein one must differentiate between imaging methods (Magnetic Resonance Imaging, MRI) and spectroscopic methods. To obtain good spatial or spectral resolution in such methods, the magnetic field in the sample volume must have good homogeneity. The geometric arrangement of the field-generating magnet coils can optimize the basic homogeneity of the superconducting magnet. Typically, recesses must be provided (so-called notch structures) wherein no wire is wound. This reduces the space for magnet windings which renders the magnet more expensive and increases the stray field.

In an arrangement according to U.S. Pat. No. 5,396,208, an MRI system is designed to be more compact by providing several soft-magnetic rings which replace certain notch structures. These soft-magnetic rings can reduce the size of the superconducting coil system in the direction of the magnet axis such that the system has an opening angle of approximately 90 degrees. A large opening angle for MRI magnet systems is advantageous for claustrophobic patients when the magnet system is used in human medical diagnosis.

In accordance with U.S. Pat. No. 5,396,208, a magnet coil system can be more effectively homogenized using a magnetic field shaping device than with notch structures. Application of this idea to a magnet arrangement for high-resolution resonance spectroscopy instead of an MRI magnet system, produces new problems. To obtain a sufficiently effective field shaping device from magnetic material, at least parts of this field shaping device must typically be mounted close to the working volume of the magnet arrangement. These parts of the field shaping device can also produce, in addition to the desired magnetic field, undesired local distortions of the magnetic field in the working volume of the magnet arrangement due to manufacturing tolerances. This problem is much greater for high-resolution resonance spectroscopic applications than for MRI applications, mainly, for the following two reasons. First of all, the homogeneity requirements on a magnet arrangement for high-resolution resonance spectroscopy are considerably higher than those for an MRI system (typically $2*10^{-4}$ ppm in a working volume of 0.2 cm³ compared to 5 ppm in a working volume of 34 liters for MRI systems). Secondly, the desired field shaping effect of the magnetic field shaping device of a magnet arrangement for high-resolution resonance spectroscopy is typically obtained with much less magnetic material due to the more compact dimensions as compared to an MRI magnet arrangement. This will produce greatly increased, undesired field distortions if the actual location of some magnetic material of the field shaping device differs from the nominal position by a certain amount. In other words: The efficiency of the magnetic field shaping device is larger with respect to its desired as well as to its undesired effects.

It is the object of the present invention to realize a field shaping device of magnetic material with a suitable geometrical shape in a magnet arrangement for high-resolution resonance spectroscopy such that at least part of the notch structures for field homogenization in the magnet coil system can be omitted and such that the influence of unavoidable manufacturing tolerances of the magnetic field shaping device on the magnetic field shape in the working volume can be sufficiently compensated.

SUMMARY OF THE INVENTION

This object is achieved in the invention by using the magnet coil system in an apparatus for high-resolution magnetic resonance spectroscopy, wherein the radial separation of the field shaping device from the z axis is at least partly less than 80 millimeters and compensates for at least 50% of at least one of the inhomogeneous field contributions $H_n \cdot z^n$ of the magnet coil system, and at least one additional coil system is provided which acts as a shim device in the magnet arrangement.

At least one of the inhomogeneous field contributions which occur in the magnet coil system due to omission of the notch structures is compensated by at least 50% by the magnetic field shaping device. The inhomogeneous field contributions have the dependence $H_n \cdot z^n$ with $n \geq 2$, i.e., their contributions to the overall field strength of the magnet coil system vary along the magnet axis (z axis) about z=0, with the nth power of z.

A particular advantage of a magnet arrangement comprising such a positioned magnetic field shaping device is that field inhomogeneities $H_n \cdot z^n$, with $n \geq 4$, can also be compensated for with small amounts of magnetic material. The efficiency of the field shaping device for compensating such field inhomogeneities would be drastically reduced if the field shaping device were completely positioned at a separation larger than 80 millimeters from the magnet axis.

One embodiment of the inventive magnet arrangement is particularly preferred, wherein the actual surface positions of the field shaping device at all locations differ at the most by $\Delta_P$ from the calculated surface positions, wherein $\Delta_P$ is given by $$\Delta_P = 0.2 \cdot \frac{\iiint_C |\Delta_C(r,z,\varphi)| \cdot \frac{|J_C(r,z,\varphi)|}{(r^2+z^2)^{k/2}} dV}{\iiint_P \frac{|\vec{\nabla} \times \vec{M}(r,z,\varphi)|}{(r^2+z^2)^{k/2}} dV}$$

with $\Delta_c$ Production tolerance for the maximum (radial or axial) displacement of a volume element dV of the magnet winding in the magnet coil system, k lowest degree, except for zero, of all those coefficients of the field of the magnet coil system, when expanded in spherical harmonic functions, for whose compensation no shim coil system is provided, wherein the degree characterizes the lower index of the Legendre function $P_k^m$ which occurs in the associated spherical harmonic, $J_c$ current density in the magnet coil system, $\vec{M}$ magnetization of the field shaping device, r radial separation of the volume element dV from the z axis, φ azimuthal angle of the volume element dV.

$$\iiint_C \ldots dV \text{ and } \iiint_P \ldots dV:$$

volume integral over the volume of the magnet coil system and the field shaping device.

The above integral over the volume of the magnet coil system is a measure of the field distortions in the working volume of the magnet arrangement which are produced by deviations of the position of the wire windings in the magnet coil system from their nominal positions due to manufacturing tolerances. The corresponding integral over the volume of the magnetic field shaping device is a measure of the field distortions which are produced by manufacturing tolerances in the field shaping device surfaces. If no actual surface of the field shaping device differs from its intended position by more than the amount $\Delta_P$, calculated according to the above formula, it is ensured that, in the working volume, the field shaping device produces substantially only undesired field distortions caused by manufacturing tolerances, which can be compensated for by the additional shim devices. The field distortions of higher order remain smaller than 20% of those field distortions which would be present in the working volume of the magnet arrangement without the magnetic field shaping device, and can therefore be tolerated.

One embodiment of the inventive magnet arrangement is particularly advantageous with which the magnet coil system has active shielding. This active shielding reduces the stray field of the magnet arrangement such that more space for other applications is available in the laboratory.

In a particularly preferred embodiment of the inventive magnet arrangement, the magnet arrangement is provided with passive shielding. The passive shielding has the great advantage over active shielding that it can even increase the field in the working volume.

In a further preferred embodiment of the inventive magnet arrangement, the field shaping device is disposed at least partially radially within the innermost wire winding of the magnet coil system. The efficiency of the field shaping device for compensating the inhomogeneous field contributions $H_n \cdot z^n$ of the magnet coil system is particularly small for close separations from the z-axis.

One embodiment of the inventive magnet arrangement is also advantageous with which the field shaping device is magnetically completely saturated and magnetized only in the axial direction (a direction parallel to the z axis). In this case, calculation of the field produced by the field shaping device is particularly simple and precise.

In two further embodiments, the magnet arrangement is characterized in that the magnetic field of the field shaping device comprises a part $H_4 \cdot z^4$ with $H_4>0$, whose field contribution on the z axis about z=0 varies with the fourth power of z. Moreover, the contribution $H_6 \cdot z^6$ to the magnetic field of the field shaping device is substantially zero in these two embodiments. These embodiments have the advantage that, at least part of the typically very complicated notch structures in the magnet coil system which otherwise compensate for the negative field contributions of fourth degree of the magnet coil system, can be omitted due to the positive contribution $H_4 \cdot z^4$ of the field shaping device to the overall field of the magnet arrangement. In addition, the negligible contribution of sixth degree from the field shaping device ensures that the total amount of sixth degree contributions to the magnet arrangement is not increased by the field shaping device. This is important since this part of the magnetic field normally determines the size of the volume in which the field of the magnet arrangement has the homogeneity required for high-resolution resonance spectroscopy.

In a particularly preferred embodiment, the field shaping device consists of a ring which is located on an average radius a and extends axially between $-z_1$ und $z_1$, wherein $z_1>a$. This solution is particularly attractive due to the simple geometry of the field shaping device.

In a further advantageous embodiment of the inventive magnet arrangement, the field shaping device comprises two rings which are located on an average radius a and extend axially between $z_1$ and $z_2$ and between $-z_2$ and $-z_1$, wherein $0.42a<z_1<0.46a$ and $a<z_2$. Similar to the above-mentioned embodiment, such a field shaping device only produces a small $H_6 \cdot z^6$ contribution to the field in the sample volume. The field contribution of order $H_4 \cdot z^4$ with $H_4>0$ is considerably larger than in the previous embodiment.

In a further advantageous embodiment of the inventive magnet arrangement, the field shaping device comprises components of soft iron. Advantageously, soft iron has large permeability and high saturation induction. These properties provide the field shaping device with high magnetization such that even small amounts of material produce high field efficiency.

In an additional advantageous embodiment of the inventive magnet arrangement, parts of the field shaping device are subjected to surface treatment, in particular, galvanization. This surface treatment offers optimum protection from corrosion which is absolutely necessary, in particular, for components made of soft iron.

In one particularly preferred embodiment of the inventive magnet arrangement, the field shaping device consists of one single element of magnetic material. This is the simplest possible embodiment for the field shaping device with regard to production and assembly.

In another advantageous embodiment of the inventive magnet arrangement, the field shaping device comprises several elements of magnetic material. This offers more freedom for optimizing the field shaping device.

In a further advantageous embodiment of the inventive magnet arrangement, the field shaping device comprises magnetic sheets which are disposed on a carrier device. The efficiency of the magnetic material close to the z axis is sufficiently large that little material is required for producing the desired field shape. Sheets therefore offer an ideal solution, in particular since they have a substantially non-varying thickness.

Two further advantageous embodiments of the inventive magnet arrangement are characterized in that existing components of the magnet arrangement can be utilized for the field shaping device. In the first embodiment, the field shaping device comprises components which are part of a coil form of the magnet coil system. Magnetic material can e.g. be evaporated onto a carrier device.

In the second embodiment, the field shaping device comprises components which are part of the cryostat in which the magnet coil system is accommodated. Both embodiments have the advantage that no additional parts are required for the field shaping device, thereby saving space e.g. for magnet windings.

In a further embodiment, the magnet arrangement is characterized in that the field shaping device comprises components which are disposed in a region of the magnet arrangement which is at room temperature. These components are easily accessible during operation and can be modified without heating up the magnet coil system.

In a particularly preferred embodiment of the inventive magnet arrangement, the field shaping device comprises cooled components, in particular such that these have the temperature of the liquid helium bath which cools the magnet coil system. The low temperature advantageously improves the magnetic properties of the magnetic material, i.e., larger magnetization for a given external field. When the temperature is stable, fluctuations in the magnetization are also suppressed which guarantees improved temporal stability of the homogeneity of the magnet arrangement.

A method for determining the production tolerances of the magnetic field shaping device also lies within the scope of the present invention and is characterized in that the value $\Delta_P$, which determines the maximum deviation of the actual surfaces of the field shaping device at any location from the ideal surface locations, is calculated, wherein $\Delta_P$ is given by $$\Delta_P = 0.2 \cdot \frac{\iiint\limits_C |\Delta_C(r, z, \varphi)| \cdot \frac{|J_C(r, z, \varphi)|}{(r^2 + z^2)^{k/2}} dV}{\iiint\limits_P \frac{|\vec{\nabla} \times \vec{M}(r, z, \varphi)|}{(r^2 + z^2)^{k/2}} dV}$$

with $\Delta_c$ production tolerance for the maximum (radial or axial) displacement of a volume element dV of the magnet winding in the magnet coil system, k the lowest degree, except for zero, of all coefficients of the field of the magnet coil system in the expansion according to spherical harmonic functions which is not compensated for by a shim coil, wherein the degree characterizes the lower index of the Legendre function $P_k^m$ occurring in the associated spherical harmonic, $J_c$ current density in the magnet coil system, $\vec{M}$ magnetization of the field shaping device, r radial separation between volume element dV and z-axis, φ azimuthal angle of the volume element dV.

$$\iiint\limits_C \ldots dV \text{ and } \iiint\limits_P \ldots dV:$$

volume integral over the volume of the magnet coil system or the field shaping device.

Keeping the determined production tolerances for the magnetic field shaping device ensures that the field shaping device produces substantially only undesired field distortions in the working volume, which can be compensated for by the shim devices, wherein the field distortions of higher order remain smaller than 20% of those field distortions which would be present in the working volume of the magnet arrangement without the magnetic field shaping device.

Further advantages of the invention can be extracted from the description and the drawing. The features mentioned above and below can be used in accordance with the invention either individually or collectively in any arbitrary combination. The embodiments shown and described are not to be understood as exhaustive enumeration but rather have exemplary character for describing the invention.

The invention is shown in the drawing and further explained by means of embodiments.

DESCRIPTION OF THE PREFERRED EMBODIMENT

Figure 1:
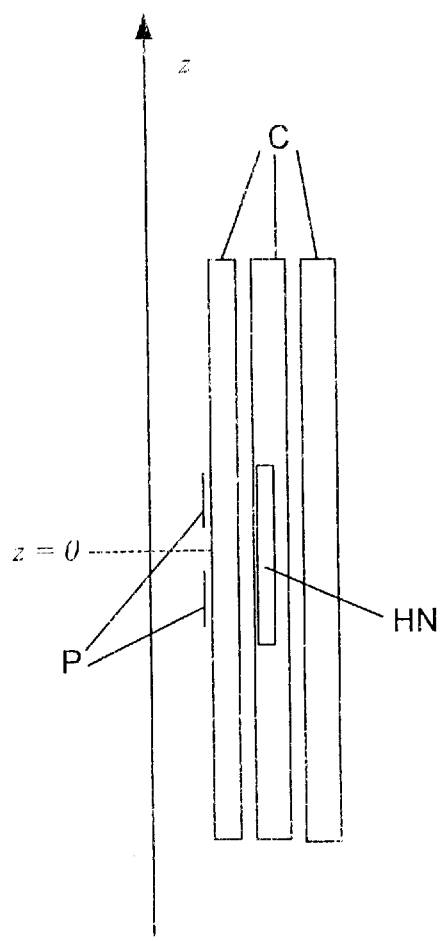
FIG. 1 shows a schematic vertical section through a radial half of the inventive magnet arrangement.

FIG. 1 shows an inventive magnet arrangement which comprises a magnet coil system C and a magnetic field shaping device P. The field shaping device P is typically at least partly closer to the z axis than the magnet coil system C. The central section shows a so-called half notch HN (region with half the current density) which is required for producing a homogeneous field in the sample volume.

Figure 2:
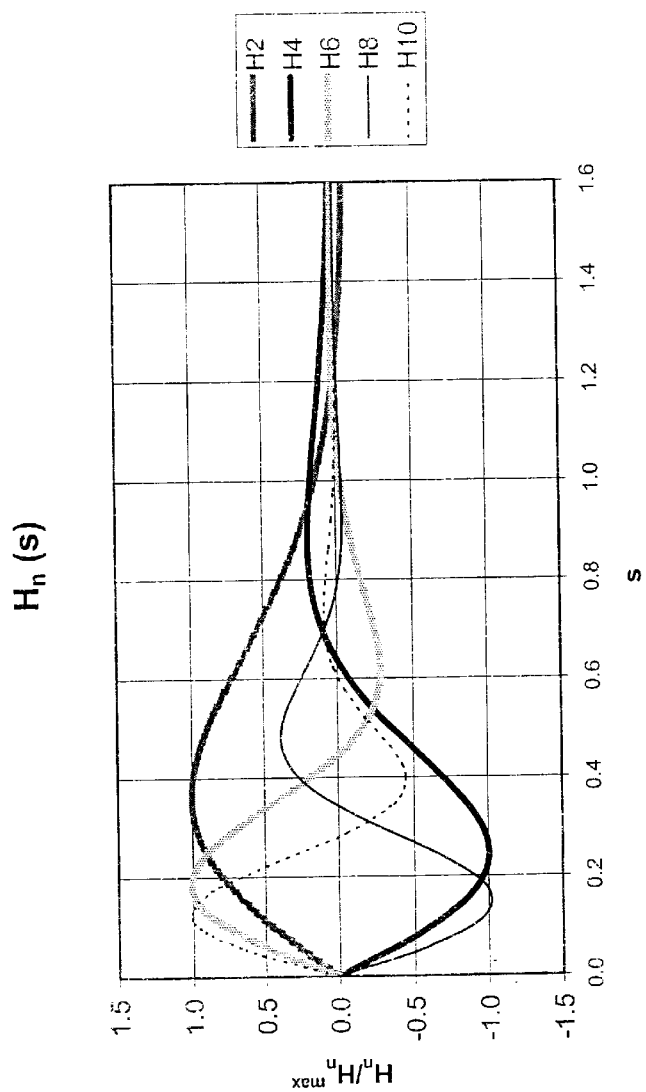
FIG. 2 shows the functions $H_n(s)$ for determining the field shape of a field shaping device comprising annular elements of magnetic material which are magnetized only in the axial direction.

FIG. 2 shows the scaled functions $H_n(s)$, which designate the field contributions $H_n(s)z^n$ in the sample volume for thin-walled cylindrical field shaping devices with purely axial magnetization. The dimension-less value s is the ratio between the axial length and the diameter of a thin-walled cylindrical field shaping device which is centered about z=0. For illustration of the set of curves, all functions were normalized to 1.

The invention is explained below with reference to two embodiments of a superconducting magnet arrangement which each produce a magnetic field of 9.4 Tesla in the sample volume. Niob titanium is used as the superconducting material. The magnet is operated in a liquid helium bath at a temperature of 4.2 Kelvin.

The first magnet arrangement (referred to as embodiment "V1" below) comprises a magnet coil system C with 3 magnet sections of the same polarity. To make the field in the sample volume homogeneous, the central section comprises a region of half the current density (half notch). The magnet coil system in the embodiment V1 is a conventional magnet coil system. The magnet current for this arrangement is 77.2 ampere and the free inner bore has a diameter of 80 millimeters.

Table 1 shows the most important features of the magnet arrangement in the embodiment V1.

TABLE 1

|  | Section 1 | Section 2 | Section 3 | Half notch |
|---|---|---|---|---|
| ri [Millimeters] | 40.0 | 67.0 | 99.2 | 70.7 |
| ra [Millimeters] | 59.9 | 92.2 | 122.9 | 81.1 |
| L [Millimeters] | 420 | 420 | 420 | 157.3 |
| W | 332 | 599 | 599 | 224 |
| N | 24 | 34 | 32 | 14 |

In TABLE 1:
ri inner radius of the solenoid coil,
ra outer radius of the solenoid coil,
L length of the solenoid coil,
W number of wire windings on each layer of the solenoid coil
N number of wire layers of the solenoid coil.

Variant V1 is compared to an inventive variant (referred to as "V2" below) which comprises a field shaping device P in addition to the magnet coil system C. In the present example, the radial dimensions of the magnet coil system C are the same as those of variant V1 and the field shaping device P consists of 2 rings of soft iron which are magnetized only axially and which are magnetically saturated (saturation induction=2.15 Tesla). These rings have a diameter of 70 mm, a wall thickness of 0.1 mm and an axial length of 33.5 mm. They are axially separated by 33 mm and disposed symmetrically with respect to the magnetic center. Their field contribution $H_4 \cdot z^4$, which varies in the sample volume in proportion to the fourth power of z, is particularly large. Due to this contribution, the half notch in the central magnet section can be shortened to permit shortening of the magnet sections. The current of 77.5 ampere is comparable to that of variant V1.

Table 2 shows the most important features of the magnet arrangement in the embodiment V2.

TABLE 2

|  | Section 1 | Section 2 | Section 3 | Half notch |
|---|---|---|---|---|
| ri [Millimeters] | 40.0 | 67.0 | 99.2 | 70.7 |
| ra [Millimeters] | 59.9 | 92.2 | 122.9 | 81.1 |
| L [Millimeters] | 379 | 379 | 379 | 112.8 |
| W | 300 | 540 | 540 | 161 |
| N | 24 | 34 | 32 | 14 |

In TABLE 2:
ri inner radius of the solenoid coil,
ra outer radius of the solenoid coil,
L length of the solenoid coil,
W number of wire windings on each layer of the solenoid coil,
N number of wire layers of the solenoid coil.

A comparison of tables 1 and 2 shows that use of the field shaping device P reduces the length of the solenoid coils by approximately 10%. In the embodiment V1, the region of the z axis having a field variation of less than 0.1 ppm has a length of 27 mm. In the embodiment V2, this region is 28 mm. The field shaping device therefore saves 10% of superconducting wire while maintaining the homogeneity.

However, the use of a field shaping device makes sense only if it does not produce excessive undesired field inhomogeneities. Such inhomogeneities are caused by the unavoidable manufacturing tolerances. Below, we will derive the exact manufacturing tolerances of the field shaping device which are required for keeping the homogeneity of the magnet arrangement acceptable.

The z component $B_z$ of the magnetic field can be expanded about the magnetic center using the spherical harmonic functions:

$$B_z(r, z, \varphi) = \sum_{n=0}^{\infty} \sum_{m=0}^{n} P_n^m\left(\frac{z}{\sqrt{r^2+z^2}}\right)(r^2+z^2)^{n/2}(A_{nm}\cos(m\varphi)+B_{nm}\sin(m\varphi))$$

wherein $P_n^m$ are the associated Legendre functions. The coefficients $A_{nm}$ and $B_{nm}$ are called gradients, n is the degree, m the order of the Legendre function $P_n^m$. $A_{00}$ is the z component of the magnetic field at the magnetic center. If all coefficients $A_{nm}$ and $B_{nm}$ for $0<n\leq k-1$ vanish, the homogeneity is of kth degree. This degree of homogeneity is theoretically achieved with a suitable design of the magnet arrangement. Since unavoidable manufacturing tolerances will occur, the actual field profile of a magnet arrangement will differ from this ideal form. To compensate for this deviation, the magnets for resonance spectroscopy are provided with so-called shim coils. Each of these coils can be operated with its own current and typically produces exactly one defined field gradient in the working volume. If one shim device is provided for each gradient of degree $n\leq k-1$, the magnet coil system produces, together with the shim coils, a field having a homogeneity of k-th degree, when the currents in the shim coils are properly set. The value of the coefficients of kth degree $A_{km}$ and $B_{km}$ is a measure of the remaining inhomogeneity in the magnet after shimming. In a magnet arrangement comprising a magnet coil system homogenized with notches, (as in variant V1 of the above two examples) the value of the remaining gradients $A_{km}$ and $B_{km}$ depends substantially on the amount by which the magnet windings in the coil system can deviate from their theoretically determined position. In an inventive magnet arrangement (as in variant V2 of the above-mentioned two examples), manufacturing tolerances of the magnetic field shaping device can provide additional undesired contributions to the remaining gradients $A_{km}$ and $B_{km}$. To ensure that this potential deterioration of the field homogeneity of the shimmed magnet arrangement remains within tolerable levels, the requirements on the manufacturing tolerances of inventive magnetic field shaping devices are very high.

A method is shown below for calculating a measure for the manufacturing tolerance of the field shaping device which is to be adopted. The purpose of this method initially consists in providing a quantitative relationship between the magnitude of the gradients $A_{km}$ and $B_{km}$ produced by the magnet coil system, and the manufacturing tolerance $\Delta_c$ for a maximum (radial or axial) displacement of a volume element dV of the magnet winding in the magnet coil system. Analogously, a relationship is established between the corresponding gradients produced by the field shaping device and the manufacturing tolerance $\Delta_P$ for a maximum (radial or axial) displacement of a volume element dV of the field shaping device P. Moreover, the gradients which are additionally produced by the field shaping device must not exceed an upper limit of 20% of the gradients $A_{km}$ and $B_{km}$ produced by the magnet coil system. A limiting value for $\Delta_P$ can be calculated from this condition if a realistic value for $\Delta_c$ is known. The relationship between the manufacturing tolerances $\Delta_c$ and $\Delta_P$ and the strengths of the produced gradients is derived below.

An infinitesimal volume dV at a location $(r,z,\phi)$, through which a current density J flows in an azimuthal direction, produces gradients of the values $$A_{nm} = \cos(m\varphi)\frac{f_{nm}\left(\frac{z}{r}\right)}{(r^2+z^2)^{n/2}} J dV$$

$$B_{nm} = \sin(m\varphi)\frac{f_{nm}\left(\frac{z}{r}\right)}{(r^2+z^2)^{n/2}} J dV$$

relative to the coordinate origin. The gradients are functions of some $f_{nm}$, which, in turn, depend only on the ratio z/r. The substantial result which can be gained from these formulas is that the gradients are inversely proportional to the nth power of the separation between current-carrying volume element and coordinate origin. The coordinate origin is suitably located at the magnetic center of the magnet arrangement. For a magnet coil system C whose wire windings differ at the most by an amount $\Delta_c$ from the theoretically provided position, the following value is a measure for the difference between the actual and nominal gradients of nth degree which are produced by the coil system in the working volume:

$$\iiint_C |\Delta_C(r,z,\varphi)| \cdot \frac{|J_C(r,z,\varphi)|}{(r^2+z^2)^{n/2}} dV$$

with

J_c current density in the magnet coil system C,
r radial separation between the volume element dV and the z axis,
φ azimuthal angle of the volume element dV, $$\iiint_C \ldots dV$$

volume integral over the volume of the magnet coil system C.

In correspondence thereto, for a field shaping device P whose surfaces differ at the most by an amount $\Delta_P$ from the desired surfaces, the following value is a measure for the difference between the actual and nominal gradients of nth degree which are produced by the field shaping device in the working volume:

$$\iiint_P |\Delta_P(r,z,\varphi)| \frac{|\vec{\nabla} \times \vec{M}(r,z,\varphi)|}{(r^2+z^2)^{n/2}} dV$$

with $\vec{M}$ magnetization of the field shaping device P, $$\iiint_P \ldots dV$$

volume integral over the volume of the field shaping device P.

The expression for the gradient strengths of the field shaping device was obtained from that for the magnet coil system by substituting the vector $\vec{\nabla} \times \vec{M}(r,z,\phi)$ for $J_c$, since $\vec{\nabla} \times \vec{M}(r,z,\phi)$ produces the same B field as the magnetic material of the field shaping device.

If the magnet arrangement has a shim device which compensates for gradients with n≤k−1, the gradients of in particular kth degree which cannot be shimmed must not be substantially increased (preferably by less than 20%) by the field shaping device. The production tolerance $\Delta_P$ of the field shaping device P is therefore:

$$\Delta_P < 0.2 \Delta_C \cdot \frac{\iiint_C \frac{|J_C(r,z,\varphi)|}{(r^2+z^2)^{k/2}} dV}{\iiint_P \frac{|\vec{\nabla} \times \vec{M}(r,z,\varphi)|}{(r^2+z^2)^{k/2}} dV}$$

This expression assumes, for simplicity, that both $\Delta_P$ and $\Delta_c$ are spatially independent.

This method can be used to calculate the manufacturing tolerances for the inventive field shaping device of the above-mentioned example (variant V2). In this example, the current density $J_c$ of the coil system has spatially independent regions and $\vec{\nabla} \times \vec{M}(r,z,\phi)$ is distributed over two layers of constant current density. The magnet arrangement is provided with a shim system which corrects all gradients up to and including third degree and therefore, k can be set equal to 4. The ratio between the two integrals in the above formula is numerically calculated to be 0.5. The manufacturing tolerance $\Delta_P$ of the field shaping device is therefore:

$$\Delta_P \leq 0.1 \Delta_c.$$

If the accuracy $\Delta_c$ of the windings of the magnet coil system is 0.1 mm, a maximum production tolerance $\Delta_P$ of 0.01 mm is required for the field shaping device.

Thanks to this method for calculating the required manufacturing tolerances of the magnetic field shaping device, a suitable production method for the field shaping device can be determined to realize an inventive magnet arrangement for high-resolution magnetic resonance spectroscopy which utilizes the advantages of a magnetic field shaping device and which simultaneously meets the high requirements for field homogeneity in the working volume.

We claim:

1. A magnet device for high-resolution magnetic resonance spectroscopy, the device producing a magnetic field in a direction of a z-axis in a working volume disposed on the z axis about z=0, the device comprising:

a superconducting magnet coil system, said magnet coil system producing a magnetic field in the working volume with at least one inhomogeneous contribution $H_n \cdot z^n$ with n≧2, whose contribution to a total field strength on the z axis about z=0 varies with an nth power of z;

a field shaping device of magnetic material, said field shaping device being substantially cylindrically symmetrical with respect to the z axis, at least a portion of said field shaping device having a radial separation from the z axis of less than 80 mm to compensate for said inhomogeneous contribution $H_n \cdot z^n$ of said magnet coil system by at least 50%; and at least one additional coil system, said additional coil system functioning as a shim device.

2. The magnet device of claim 1, wherein all locations of actual surfaces of said field shaping device differ by not more than $\Delta_P$ from desired surface positions, wherein $\Delta_P$ is given by $$\Delta_P = 0.2 \cdot \frac{\iiint_C |\Delta_C(r,z,\varphi)| \cdot \frac{|J_C(r,z,\varphi)|}{(r^2+z^2)^{k/2}} dV}{\iiint_P \frac{|\vec{\nabla} \times \vec{M}(r,z,\varphi)|}{(r^2+z^2)^{k/2}} dV}$$

with $\Delta_c$ production tolerance for one of a maximum radial and a maximum axial displacement of a volume element dV of a magnet winding in said magnet coil system, k lowest degree, except for zero, of all those coefficients of said magnetic field of said magnet coil system in an expansion according to spherical harmonic functions, which cannot be compensated for by said additional coil system, wherein said degree designates a lower index of a Legendre function $P_k^m$ which occurs in an associated spherical harmonic, $J_c$ current density in said magnet coil system, $\vec{M}$ magnetization of said field shaping device, r radial separation between said volume element dV and the z axis, φ azimuthal angle of said volume element dV.

$$\iiint_C \ldots dV \text{ and } \iiint_P \ldots dV:$$

volume integral over a volume of said magnet coil system and said field shaping device.

3. The magnet device of claim 1, wherein said magnet coil system comprises an active shielding.

4. The magnet device of claim 1, further comprising a passive shielding.

5. The magnet device of claim 1, wherein at least a portion of said field shaping device is disposed radially within an innermost wire winding of said magnet coil system.

6. The magnet device of claim 1, wherein said field shaping device is magnetically completely saturated and magnetized only in an axial direction.

7. The magnet device of claim 6, wherein said field shaping device comprises a ring which is located on an average radius a and extends axially between $-z_1$ and $z_1$, wherein $z_1 > a$.

8. The magnet device of claim 6, wherein said field shaping device comprises two rings which are located on an average radius a and which extend axially between $z_1$ and $Z_2$ and between $-z_2$ and $-z_1$, wherein $0.42a < z_1 < 0.46a$ and $a < z_2$.

9. The magnet device of claim 1, wherein said field shaping device comprises components of soft iron.

10. The magnet device of claim 1, wherein parts of said field shaping device are one of surface treated and galvanized.

11. The magnet device of claim 1, wherein said field shaping device consists of one single element of magnetic material.

12. The magnet device of claim 1, wherein said field shaping device comprises several elements of magnetic material.

13. The magnet device of claim 1, wherein said field shaping device comprises magnetic sheets mounted onto a carrier device.

14. The magnet device of claim 1, wherein said field shaping device comprises components which are part of a coil form of said magnet coil system (C).

15. The magnet device of claim 14, wherein said magnetic material of said field shaping device is evaporated onto a carrier device.

16. The magnet device of claim 1, wherein said field shaping device comprises components which are part of a cryostat in which said magnet coil system is disposed.

17. The magnet device of claim 1, wherein said field shaping device comprises components which are disposed in a region of the magnet device which is at room temperature.

18. The magnet device of claim 1, wherein said field shaping device comprises cooled components.

19. The magnet device of claim 18, wherein said cooled components have a temperature of a liquid helium bath which cools said magnet coil system.

20. A method for determining the production tolerances of the field shaping device in the magnet device of claim 1, comprising the step of calculating a value $\Delta_P$, which designates a maximum deviation of actual positions of surfaces of said field shaping device, at any location, from intended surface positions, wherein $\Delta_P$ is given by $$\Delta_P = 0.2 \cdot \frac{\iiint_C |\Delta_C(r,z,\varphi)| \cdot \frac{|J_C(r,z,\varphi)|}{(r^2+z^2)^{k/2}} dV}{\iiint_P \frac{|\vec{\nabla} \times \vec{M}(r,z,\varphi)|}{(r^2+z^2)^{k/2}} dV}$$

with $\Delta_c$ production tolerance for one of a maximum radial and a maximum axial displacement of a volume element dV of a magnet winding in said magnet coil system, k lowest degree, except for zero, of all those coefficients of said magnetic field of said magnet coil system in an expansion according to spherical harmonic functions which is not compensated for by said additional coil system, wherein said degree designates a lower index of a Legendre function $P_k^m$ occurring in a corresponding spherical harmonic function, $J_c$ current density in said magnet coil system, $\vec{M}$ magnetization of said field shaping device, r radial separation between a volume element dV and the z-axis, φ azimuthal angle of said volume element dV, $$\iiint_C \ldots dV \text{ and } \iiint_P \ldots dV:$$

volume integral over a volume of said magnetic coil system and of said field shaping device.

* * * * *